Figure 1:
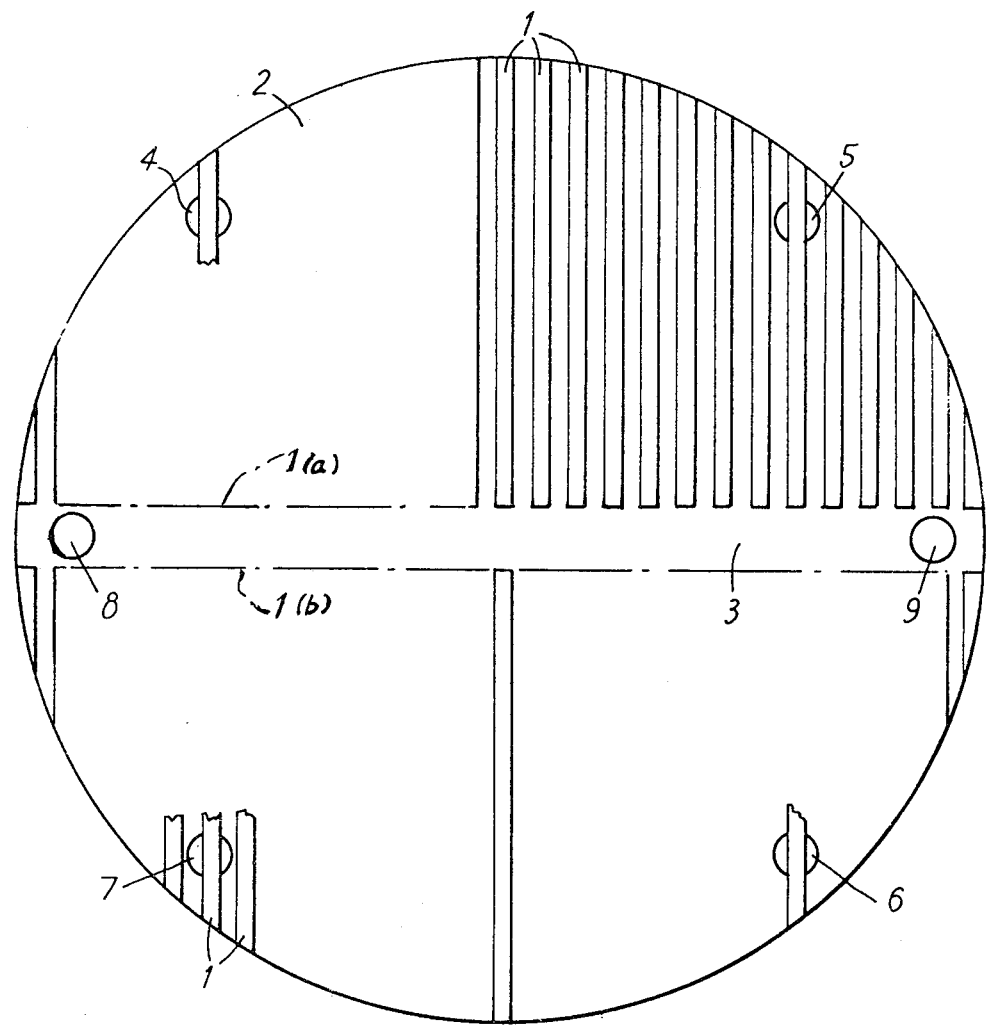

United States Patent [19]

Oley

[11] Patent Number: 4,477,826

[45] Date of Patent: Oct. 16, 1984

[54] ARRANGEMENT FOR ALIGNING AND ATTACHING A SHIM TO A SEMICONDUCTOR ELEMENT

[75] Inventor: Nicholas R. Oley, Chippenham, England

[73] Assignee: Westinghouse Brake & Signal Co. Ltd., England

[21] Appl. No.: 243,904

[22] PCT Filed: Jul. 3, 1980

[86] PCT No.: PCT/GB80/00113

§ 371 Date: Mar. 4, 1981

§ 102(e) Date: Feb. 24, 1981

[87] PCT Pub. No.: WO81/00172

PCT Pub. Date: Jan. 22, 1981

[30] Foreign Application Priority Data

Jul. 4, 1979 [GB] United Kingdom ............... 7923223

[51] Int. Cl.³ .................. H01L 23/48; H01L 29/40; H01L 23/42
[52] U.S. Cl. ........................................ 357/68; 357/65; 357/79
[58] Field of Search .................. 357/65, 68, 79, 85

[56] References Cited

U.S. PATENT DOCUMENTS

| 3,418,543 | 12/1968 | Marino et al. | 357/68 |
| 3,473,303 | 10/1969 | Lutz | 357/68 |
| 3,931,635 | 1/1976 | Sundström | 357/79 |
| 4,289,834 | 9/1981 | Alcorn et al. | 357/68 |

FOREIGN PATENT DOCUMENTS

| 2543651 | 4/1976 | Fed. Rep. of Germany | 357/68 |
| 935710 | 9/1963 | United Kingdom | 357/68 |

Primary Examiner—Andrew J. James
Assistant Examiner—John Lamont
Attorney, Agent, or Firm—Larson and Taylor

[57] ABSTRACT

A contact shim for insertion between an electrode internal contact member and a contact surface of a semiconductor element in a semiconductor device assembly. The shim has a generally continuous body (2) provided with a number of apertures (4, 5, 6, 7) having a land (1) or finger extending at least partially thereacross, preferably a land comprises a bar which bisects an aperture (4, 5, 6, 7). The apertures and bisecting lands may be used as visual guides in aligning the shim with reference marks on the contact surface of the semiconductor element and, the means of attaching the shim to the element may be applied to the lands in order that any distortion consequent upon attachment is confined to the lands leaving the body of the shim undistorted.

7 Claims, 5 Drawing Figures

SECTION Y-Y

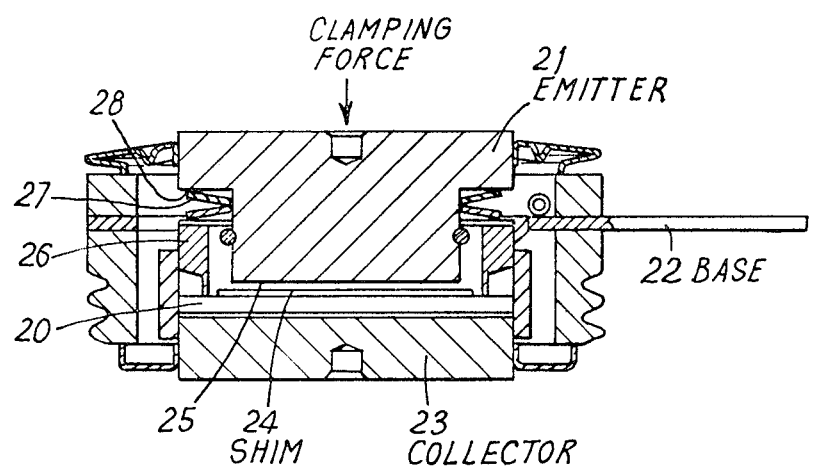
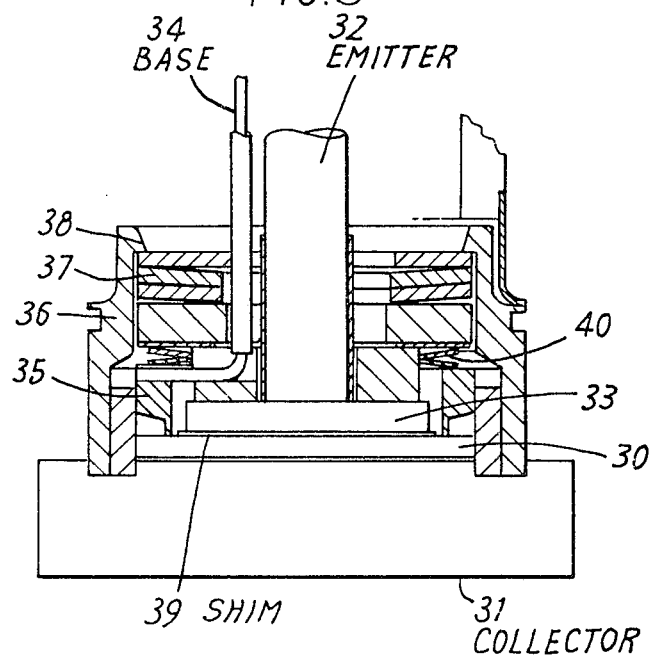

ARRANGEMENT FOR ALIGNING AND ATTACHING A SHIM TO A SEMICONDUCTOR ELEMENT

The invention relates to a semiconductor device assembly.

Shims are used in a variety of semiconductor devices inserted between an electrode contact member and the respective surface of the semiconductor element itself. Such arrangements are associated with but not necessarily restricted to the mounting of high current and physically large semiconductor elements. A contact shim is particularly useful where the surface of one semiconductor region is not a contiguous area but is, for example, interdigitated with a surface of a different semiconductor region. In such instances there arise the problems of accurate alignment of the shim and its secure attachment, preferably to the semiconductor element, with minimum loss of contact surface due to e.g. distortion caused by attachment means.

According to one aspect of the present invention there is provided a semiconductor device assembly comprising a semiconductor element having an end face formed with a surface region and a plurality of alignment marks, an electrode to be electrically connected with the surface region, a contact member connected with the electrode and positioned adjacent to the end face of the semiconductor element, means for urging the contact member towards the semiconductor element, and a shim interposed between the contact member and the semiconductor element, said shim including a plurality of alignment means formed therein in positions corresponding to the alignment marks on the semiconductor element so that the shim may be aligned with the surface region of the semiconductor element, said alignment means comprising an aperture formed in the shim and a land extending at least partly across the aperture, and attachment means applied to the lands in the aperture for attaching the shim to the semiconductor element.

According to another aspect of the invention there is also provided a semiconductor device assembly comprising a semiconductor transistor element having an emitter region which forms at an end face a surface region comprising a set of parallel linear ribs, a plurality of alignment marks formed on said end face, an emitter electrode which is to be electrically connected with the emitter surface region, a contact member connected with the electrode and positioned adjacent to the end face of the semiconductor element, means for urging the contact member towards the semiconductor element, and a shim interposed between the contact member and the semiconductor element, said shim being formed with a raised portion of parallel linear ribs which is the mirror-image of the emitter region, a plurality of alignment means formed in the shim in positions corresponding to the alignment marks on the semiconductor element so that raised portion of the shim may be aligned with the emitter region of the semiconductor element, said alignment means comprising an aperture formed in the shim and a land extending at least partly across the aperture, said land being constituted by one of said raised ribs, and ultrasonic welds, applied to the lands in the aperture, for attaching the shim to the semiconductor element.

Figure 2:
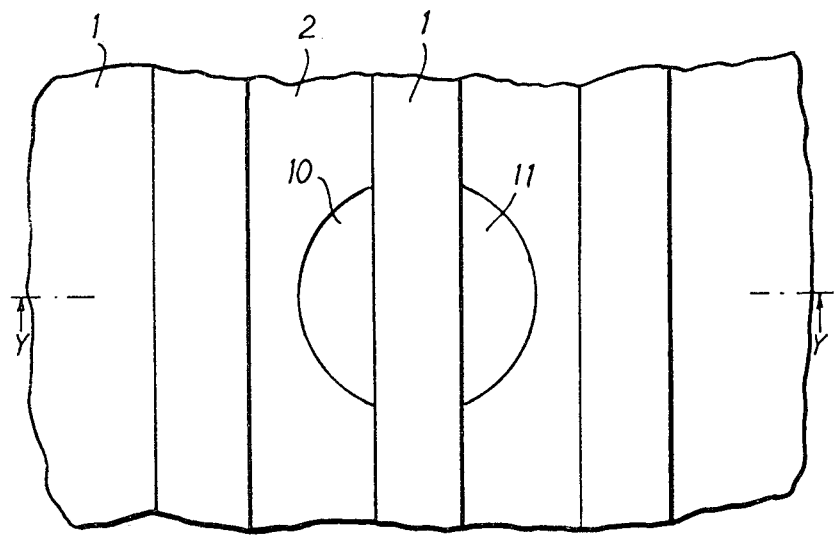
Figure 3:
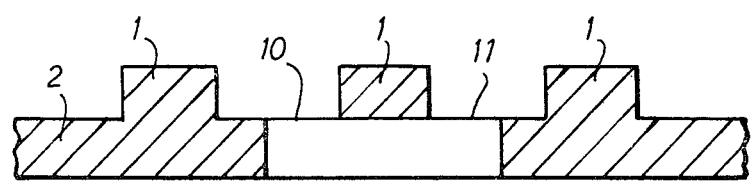

In order to illustrate how the invention may be readily carried into practice an embodiment will now be described by way of example only and with reference to the accompanying drawings, in which:

FIG. 1 shows a plan view of a preferred shim member viewed from the raised region side, FIG. 2 shows a detailed view of one of the alignment holes of the shim of FIG. 1, FIG. 3 shows a view on section Y—Y in FIG. 2, and FIGS. 4 and 5 show cross sections through transistor assemblies.

The embodiment to be described is a high current transistor comprising a relatively physically large semiconductor element in the form of a diffused circular silicon slice of approximately thirty millimeters diameter on one face of which emitter and base contacts are formed, separated by a channel of insulating semiconductor oxide and corresponding to the interfitting emitter and base region patterns.

The particular emitter pattern in this embodiment is in the form of a set of parallel linear ribs divided into two approximately semi-circular halves by an unribbed diametrical channel.

The contact shim referred to above is shown in plan view in FIG. 1 of the drawings. A set of parallel linear raised ribs 1 are formed on the face of a circular generally plane aluminum shim base 2. The set of ribs is divided in two substantially semi-circular halves generally indicated at 1(a) and 1(b) by an unribbed channel 3 formed along a diameter perpendicular to the ribs and in the plane of the shim.

The spacing of the ribs formed on the shim on the semiconductor element emitter contact member are identical (within manufacturing tolerances) and mirror-imaged and the shim ribs are slightly narrower so that exact register of the patterns can be obtain with no overlap when the shim is positioned against the emitter and correctly aligned therewith.

In order to assist in the task of alignment of the two rib patterns, a plurality of circular alignment apertures 4, 5, 6 and 7 are formed in the generally plane body or base layer 2 of the shim overlapping parts of respective ribs 1. Two further alignment apertures 8 and 9 are also formed in the unribbed channel 3. The diameter of the apertures 4, 5, 6 and 7 is greater than the width of the ribs 1 so that the raised rib which remains after the holes forms a land extending across the aperture which in this particular example bisects the hole and forms two D-shaped viewing apertures 10 and 11 in FIGS. 2 and 3, on opposite sides of a rib 1. The apertures 8 and 9 have diameters slightly less than the width of channel 3. During assembly the alignment apertures 4, 5, 6 and 7 are used to align the shim ribs angularly and transversely with respect to the rib pattern on the emitter contact member, and the apertures 8 and 9 are used for alignment in the direction of the ribs by matching the ends of the ribs adjoining the channel 3. When accurately aligned, the shim is then anchored to the emitter contact member of the semiconductor element by spot-welds made ultrasonically at points on the ribs 1 within the perimeter of the alignment apertures 4, 5, 6 and 7. The sub-assembly thus produced is then ready for assembly into the device housing capsule as described above. Attachment means other than ultrasonic welding which may be used includes laser welding, soldering and the use of adhesive bonding. In the example being described, the dimensions of the shim are as follows, shim diameter 30 mm, rib width and spacing 0.5 mm, alignment apertures 4, 5, 6 and 7 have diameters 1.37 mm and are positioned at the corners of a square lying on a pitch circle diameter 13.125 mm. The shim base is 0.125 mm thickness and total thickness including rib is 0.25 mm. The alignment apertures and the ribs are formed by chemical etching and as can be seen in the sectional view of FIG. 3, only the base layer is removed to form the alignment apertures leaving full or partial rib thickness.

The diameter of the alignment holes bisected by the ribs was carefully determined to allow the ribs thus exposed to be ultrasonically welded without causing distortion to the main body of the shim. The process of ultrasonic welding tends to cause metal to flow from underneath the welding tip into the surrounding body of metal thus causing local distortions. The extent of such distortions is determined by several factors principally, metal ductility, ultrasonic vibration characteristics and welding tip dimensions and shape. If the distortions are not fully absorbed by the rib within the perimeter of an aperture the contact surface of the major portion of the body of the shim may be permanently distorted such that in the final assembly there is clearance between part of the ribbed shim surface and the emitter contact.

In the present example being described, rib-like base and emitter regions in the transistor are interdigitated, it is necessary therefore for the shim rib height (or depth) to be sufficient such that should the shim base be distorted by clamping forces in the final assembly that no part of the emitter shim can make contact with a base contact surface and thus short the base-emitter junction.

The above-described example possess parallel linear ribs in the pattern of the raised portion. It is known in the semiconductor field to employ other raised patterns, for example, patterns corresponding to the shape of a distributed gate in the thyristor field. Thus it is to be understood that the invention may be applied to devices other than transistors and in conjunction with patterns other than the linear ribbed pattern illustrated. In this connection the emitter contact need not be ribbed, having instead a plane surface, similarly the shim need not have a ribbed raised surface pattern. It is, however, preferred to retain a rib or bar across each of the alignment apertures to which spot-welds or other attachment means for anchoring the shim are made and to dispose the alignment apertures symmetrically with respect to the configuration of semiconductor element.

Instead of the shim being formed with raised regions, e.g. ribs, these could be formed on the emitter contact of the transistor and a planar shim employed. Such an arrangement could retain the alignment apertures and ultrasonic welding or any other method of attachment as described. Alternatively, both shim and semiconductor element contact could be formed with raised regions, and joined in similar manner.

FIGS. 4 and 5 show in cross section two known transistor constructions in which a shim of the present invention may be included and which may be assembled according to a method hereinbefore described. In the FIG. 4 arrangement the transistor semiconductor element is indicated by reference 20, and the electrodes 21, 22, 23 connected to the three regions of the transistor are correspondingly labelled, emitter, base and collector. In this particular arrangement an emitter shim 24 is attached to the emitter surface region of element 20 but the inner contact surface 25 of the emitter electrode is not permanently in contact therewith. Element 20 is clamped in position against the inner face of collector electrode 23 by a base connector member 26. The shim 24 is attached by welding or adhesive to the emitter region but is only contacted by emitter electrode face 25 when a clamping force is applied in the direction of the arrow in the drawing to compress the spring 27 which normally acts against the underside 28 of an annular shoulder formed around the periphery of electrode 21 to urge the electrode away from the semiconductor element. When installed for use the transistor is clamped in place with the outer exposed face of emitter electrode 21 against the receiving face of a heat sink (not shown).

The FIG. 5 arrangement is commonly referred to as a "top-hot" encapsulation after the outline of a side view of the device. Here a semiconductor transistor element 30 is permanently clamped between a collector pole piece 31 and an emitter rod 32 formed with an inner flanged head 33. A base electrode 34 is also connected to the element 30 by means of a base connector member 35. The housing is formed by a generally cylindrical body 36 within which the electrode-element assembly is mounted. A series of springs 37, retained in the housing body 36 by tabs 38, exerted a downward force on the flanged head 33 the lower face of which is thereby urged into contact with an emitter shim 39 attached to the upper face of element 30. the base connector 35 is also urged into contact with an upper surface of the base region of element 30 by further springs 40.

In both of these transistors, as foreshadowed above the emitter surfaces to which shims are attached are not necessarily continuous areas. Indeed to achieve adequate control of device conduction it is normal to employ interleaved base-emitter surface contact configurations.

I claim:
1. A semiconductor device assembly comprising a semiconductor element having an end face formed with a surface region and a plurality of alignment marks, an electrode to be electrically connected with the surface region, a contact member connected with the electrode and positioned adjacent to the end face of the semiconductor element, means for urging the contact member towards the semiconductor element, and a shim interposed between the contact member and the semiconductor element, said shim including a plurality of alignment means formed therein in positions corresponding to the alignment marks on the semiconductor element so that the shim may be aligned with the surface region of the semiconductor element, said alignment means comprising an aperture formed in the shim and a land extending at least partly across the aperture, and attachment means applied to the lands in the aperture for attaching the shim to the semiconductor element.

2. An assembly according to claim 1 wherein the apertures formed in the shim are of generally circular configuration.

3. An assembly according to claim 2 wherein each land bisects a circular aperture.

4. An assembly according to claim 3 wherein the shim is formed with a raised pattern adjacent the semiconductor element which is a mirror-image of the surface region and which comprises a set of parallel linear ribs, at least one of said ribs bisecting an aperture to form the said land extending at least partly across said aperture.

5. An assembly according to claim 1 wherein the attachment means comprises a weld.

6. An assembly according to claim 1 wherein the attachment means comprises an adhesive.

7. A semiconductor device assembly comprising a semiconductor transistor element having an emitter region which forms at an end face a surface region comprising a set of parallel linear ribs, a plurality of alignment marks formed on said end face, an emitter electrode which is to be electrically connected with the emitter surface region, a contact member connected with the electrode and positioned adjacent to the end face of the semiconductor element, means for urging the contact member towards the semiconductor element, and a shim interposed between the contact member and the semiconductor element, said shim being formed with a raised portion of parallel linear ribs which is the mirror-image of the emitter region, a plurality of alignment means formed in the shim in positions corresponding to the alignment marks on the semiconductor element so that raised portion of the shim may be aligned with the emitter region of the semiconductor element, said alignment means comprising an aperture formed in the shim and a land extending at least partly across the aperture, said land being constituted by one of said raised ribs, and ultrasonic welds, applied to the lands in the aperture, for attaching the shim to the semiconductor element.

* * * * *